United States Patent
Wada et al.

(10) Patent No.: US 9,379,094 B2
(45) Date of Patent: Jun. 28, 2016

(54) LIGHT EMITTING DEVICE AND METHOD FOR MANUFACTURING THE SAME INCLUDING A LIGHT-REFLECTIVE RESIN

(71) Applicant: TOYODA GOSEI CO., LTD., Kiyosu-shi (JP)

(72) Inventors: Satoshi Wada, Kiyosu (JP); Kosei Fukui, Kiyosu (JP); Takashi Nonogawa, Kiyosu (JP)

(73) Assignee: TOYODA GOSEI CO., LTD., Kiyosu-shi, Aichi-ken (JP)

( * ) Notice: Subject to any disclaimer, the term of this patent is extended or adjusted under 35 U.S.C. 154(b) by 0 days.

(21) Appl. No.: 14/616,568

(22) Filed: Feb. 6, 2015

(65) Prior Publication Data
US 2015/0262987 A1  Sep. 17, 2015

(30) Foreign Application Priority Data

Mar. 12, 2014  (JP) ................. 2014-048361
Sep. 10, 2014  (JP) ................. 2014-183831

(51) Int. Cl.
*H01L 25/16* (2006.01)
*H01L 29/866* (2006.01)
*H01L 33/50* (2010.01)
*H01L 33/54* (2010.01)
(Continued)

(52) U.S. Cl.
CPC ............ *H01L 25/167* (2013.01); *H01L 25/165* (2013.01); *H01L 29/866* (2013.01); *H01L 33/46* (2013.01); *H01L 33/505* (2013.01); *H01L 33/54* (2013.01); *H01L 33/60* (2013.01); *H05B 33/0803* (2013.01); *H01L 25/0753* (2013.01); *H01L 33/56* (2013.01); *H01L 2224/16225* (2013.01); *H01L 2924/181* (2013.01); *H01L 2933/005* (2013.01); *H01L 2933/0041* (2013.01); *H01L 2933/0058* (2013.01); *H05B 33/089* (2013.01)

(58) Field of Classification Search
CPC ........................................................ H01L 33/54
See application file for complete search history.

(56) References Cited

U.S. PATENT DOCUMENTS

2009/0166657 A1    7/2009  Yamada et al.
2011/0068467 A1*   3/2011  Ozaki ............... H01L 21/56
                                                257/737
(Continued)

FOREIGN PATENT DOCUMENTS

EP    2 444 715 A2    4/2012
EP    2 448 028 A2    5/2012
(Continued)

OTHER PUBLICATIONS

Extended European Search Report dated Jul. 21, 2015.

*Primary Examiner* — Victor A Mandala
*Assistant Examiner* — Regan J Rundio
(74) *Attorney, Agent, or Firm* — McGinn IP Law Group PLLC

(57) ABSTRACT

A light emitting device includes a substrate, a light-emitting diode chip mounted on the substrate, a Zener diode chip mounted next to the light-emitting diode chip on the substrate, a frame-like dam material formed on the substrate to surround the light-emitting diode chip and the Zener diode chip, and a light-reflective resin injected inside the dam material to coat side surfaces of the light-emitting diode chip and side surfaces and an upper surface of the Zener diode chip. A part of the frame-like dam material swells outward to surround three of the side surfaces of the Zener diode chip.

20 Claims, 14 Drawing Sheets

(51) Int. Cl.
*H01L 33/60* (2010.01)
*H01L 33/46* (2010.01)
*H01L 25/075* (2006.01)
*H05B 33/08* (2006.01)
*H01L 33/56* (2010.01)

(56) References Cited

U.S. PATENT DOCUMENTS

| | | | |
|---|---|---|---|
| 2011/0147954 A1* | 6/2011 | Kitamura | H01L 21/563 257/789 |
| 2011/0254022 A1 | 10/2011 | Sasano | |
| 2012/0104452 A1 | 5/2012 | Miyoshi et al. | |
| 2012/0112227 A1 | 5/2012 | Toyama | |
| 2012/0193651 A1 | 8/2012 | Edmond et al. | |
| 2013/0077299 A1 | 3/2013 | Hussell et al. | |

FOREIGN PATENT DOCUMENTS

| | | | |
|---|---|---|---|
| EP | 2 444 715 A3 | | 5/2013 |
| JP | 2012-079817 A | | 4/2012 |
| JP | 2012099544 A | * | 5/2012 |
| JP | 2014-099544 A | | 5/2014 |
| JP | 2014-099545 A | | 5/2014 |

* cited by examiner

F I G. 5
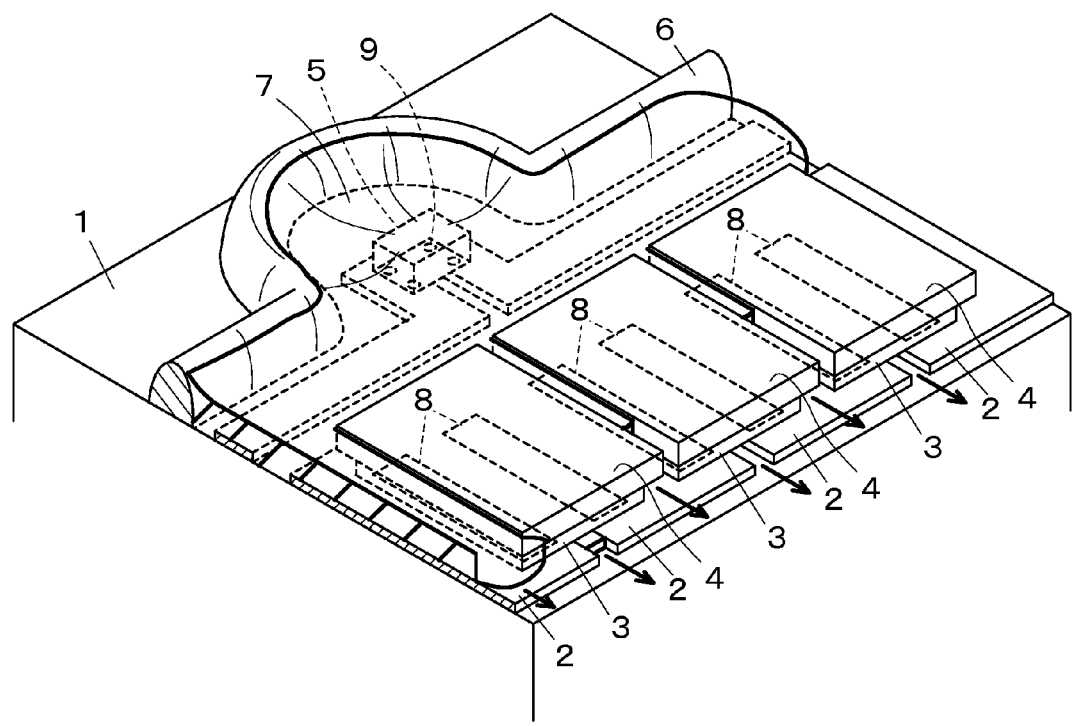

F I G. 1 2
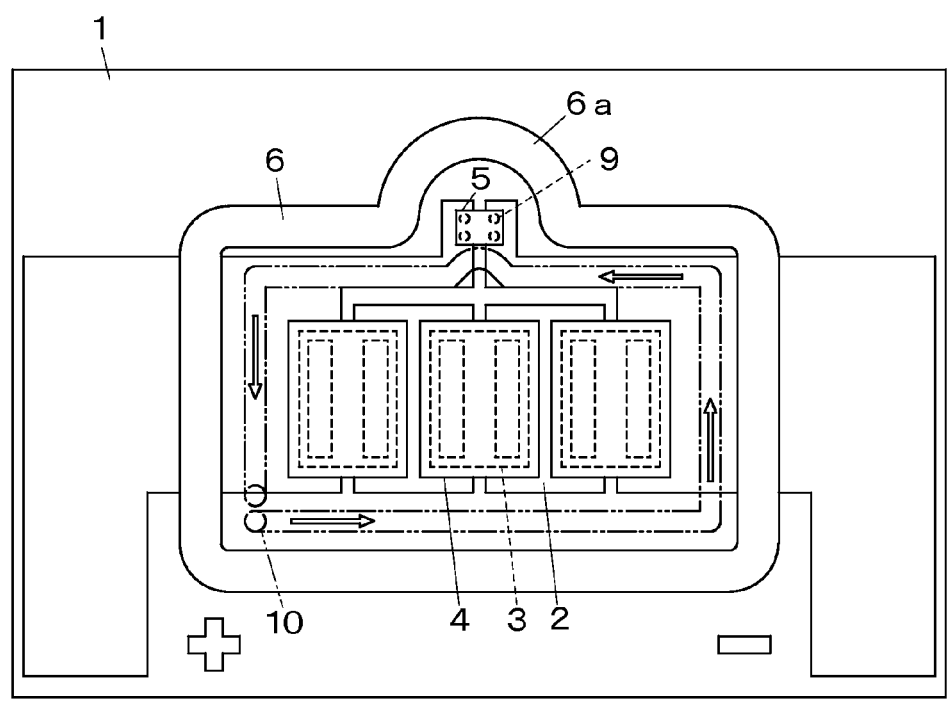

LIGHT EMITTING DEVICE AND METHOD FOR MANUFACTURING THE SAME INCLUDING A LIGHT-REFLECTIVE RESIN

TECHNICAL FIELD

The present invention relates to a light emitting device including a light-emitting diode (LED) and a Zener diode (ZD) that serves as a protective element for the LED, in which side surfaces of the LED are coated with a light-reflective resin. Herein, an LED chip may be referred to simply as an "LED", a ZD chip may be referred to simply as a "ZD", and both the LED chip and the ZD chip may be collectively referred to as a "chip".

BACKGROUND ART

In recent years, the range of use of LEDs has been widened rapidly, and the LEDs are used for headlights for automobiles. For the headlights, it is required to provide not only high-intensity light but also light having specific light distribution. In order to control light distribution, there is proposed a light emitting device in which side surfaces of an LED are coated with a light-reflective resin.

For example, Patent Document 1 describes a light emitting device including, as illustrated in FIGS. 14A and 14B: a substrate 51, on the upper surface of which wiring patterns 52 are provided; LEDs 53 mounted on two wiring patterns 52 with a predetermined clearance therebetween through flip-chip mounting to emit blue light; a translucent fluorescent plate 54 containing a fluorescent substance in abutment with the upper surfaces of the LEDs 53; a ZD 55 serving as a protective element mounted on two wiring patterns 52 with a predetermined clearance therebetween through flip-chip mounting; a frame-like dam material 56 that surrounds the LEDs 53 and the ZD 55; and a light-reflective resin 57 injected inside the dam material 56 to coat the side surfaces of the LEDs 53 and the side surfaces of the fluorescent plate 54 and coat the side surfaces and the upper surface of the ZD 55. The upper surface of the fluorescent plate 54, which serves as a light output surface, is not coated with the light-reflective resin 57 but exposed.

The blue light emitted from the LEDs 53 is exclusively output from the upper surfaces to enter the fluorescent plate 54 with components directed transversely from the side surfaces reflected and blocked by the light-reflective resin 57 and with components directed downward from the lower surfaces reflected and blocked by the wiring patterns 52. The blue light and fluorescent light emitted when the fluorescent substance contained in the fluorescent plate 54 is excited by the blue light are synthesized so that white light is output from the upper surface of the fluorescent plate 54.

A plurality of LEDs 53 is arranged in one row with a predetermined inter-chip distance therebetween. The single fluorescent plate 54 covers the plurality of LEDs 53, and has a rectangular shape as viewed in plan. The dam material 56 is provided at a predetermined separation distance from the fluorescent plate 54, and has a rectangular frame shape that is somewhat larger than the fluorescent plate 54 as viewed in plan. The height of the dam material 56 is larger than the height of the upper surface of the ZD 55, and equal to or less than the height of the upper surface of the fluorescent plate 54.

The ZD 55 is intended to protect the LED 53 from electrostatic breakdown, and mounted in parallel with and in the opposite direction to the LED 53. It is necessary that the ZD 55 should be blocked from the outside air or the like from the viewpoint of improving reliability. Therefore, the ZD 55 is disposed inside the dam material 56, and the side surfaces and the upper surface of the ZD 55 are coated with the light-reflective resin 57.

CITATION LIST

Patent Documents

Patent Document 1: Japanese Patent Application Publication No. 2012-99544 (JP 2012-99544 A)

SUMMARY OF THE INVENTION

Technical Problem

In the related art, since the LED 53 and the ZD 55 are surrounded by the dam material 56 having a rectangular frame shape as viewed in plan as described above, the following problems are caused.

(a) During manufacture, the light-reflective resin 57 is injected by discharging the light-reflective resin 57 from the opening portion of a dispenser nozzle 60 to a space between the fluorescent plate 54 and the dam material 56 as illustrated in FIGS. 14A and 14B.

If the light-reflective resin 57 is injected so as not to be directly applied to the upper surface of the ZD 55, the light-reflective resin 57 does not easily flow from the side surfaces onto the upper surface of the ZD 55. Therefore, the upper surface of the ZD 55 may not be completely coated.

Thus, the light-reflective resin 57 is injected so as to be directly applied to the upper surface of the ZD 55. In this event, however, the injected light-reflective resin 57 may flow rapidly transversely on the upper surface of the ZD 55 to flow onto the fluorescent plate 54 in proximity or leak out of the dam material 56. In order to prevent such issues, it may be necessary to increase the thickness of the fluorescent plate 54 or increase the height of the dam material 56, which introduces constraints.

(b) The ZD 55 is disposed between the fluorescent plate 54 and the dam material 56, which increases the separation distance between the fluorescent plate 54 and the dam material 56, and accordingly increases the frame dimension of the dam material 56. This reduces the area of the substrate 51 outside the dam material 56, and makes it difficult to provide space for arrangement of an attachment jig (such as a plate spring) for attachment of the substrate 51 to a device. Increasing the dimensions of the substrate 51 in order to provide such space for arrangement is disadvantageous in terms of cost.

(c) In the case where the inter-chip distance between the ZD 55 and the LEDs 53 is reduced so that the frame dimension of the dam material 56 is small, heat of the LEDs 53 is easily transmitted to the ZD 55. In addition, because the light-reflective resin 57 between the ZD 55 and the LEDs 53 is thin, sufficient reflection may not be obtained.

(d) A gap is created under the ZD 55. Firstly, since the ZD 55 is mounted on the two wiring patterns 52 with a predetermined clearance therebetween, the clearance forms the gap. Secondly, a gap due to a bump 59 is also created between the ZD 55 and the wiring patterns 52. It is preferable in terms of improving reliability to cause the light-reflective resin 57 to flow into the gap under the ZD 55 and function as an underfill. In this case, if the light-reflective resin 57 is injected so as to be directly applied to the upper surface of the ZD 55, the light-reflective resin 57 flows around the ZD 55 to flow into the gap under the ZD 55 from a plurality of directions as shown by the arrows in FIG. 14B. Therefore, air may be trapped under the ZD 55 as air bubbles to form a void 61.

It is therefore an object of the present invention to provide a light emitting device in which the upper surface of a ZD can be reliably coated even if a light-reflective resin is injected so as not to be directly applied to the upper surface of the ZD, the light-reflective resin hardly flows onto a fluorescent plate or hardly leaks out of a dam material, and the frame dimension of the dam material can be reduced. A further object is to prevent formation of a void under the ZD in the case where the light-reflective resin serves as an underfill for the ZD.

Solution to Problem (1) The present invention provides a light emitting device including: a substrate; an LED mounted on the substrate; a ZD mounted next to the LED on the substrate; a frame-like dam material formed on the substrate to surround the LED and the ZD; and a light-reflective resin injected inside the dam material to coat side surfaces of the LED and side surfaces and an upper surface of the ZD, in which a part of the frame-like dam material swells outward to surround three of the side surfaces of the ZD.

In an aspect, an upper surface of the LED serves as a light output surface. In another aspect, a fluorescent plate is placed on the LED so that an upper surface of the fluorescent plate serves as a light output surface.

In an aspect, the light-reflective resin flows into a gap under the ZD and serves as an underfill.

In an aspect, the light-reflective resin flows into a gap under the LED and serves as an underfill.

In a further aspect, the light-reflective resin includes a light-reflective resin for a lower layer having a relatively low viscosity before being cured and a light-reflective resin for an upper layer having a relatively high viscosity before being cured, and part of the light-reflective resin for the lower layer serves as the underfill.

According to the present invention, the following effects can be obtained.

The light-reflective resin injected inside the dam material flows into a space between the ZD and a swell portion of the dam material that surrounds three of the side surfaces of the ZD to fill the space. The light-reflective resin flows along both the side surfaces of the ZD and the inner side surface of the dam material, which tends to increase the height of the light-reflective resin. Since the light-reflective resin rises to the upper surface of the ZD from all of the three side surfaces of the ZD, the side surfaces and the upper surface of the ZD are reliably coated.

Therefore, the light-reflective resin can be injected so as not to be directly applied to the upper surface of the ZD. Thus, it is possible to prevent the light-reflective resin from flowing rapidly transversely on the upper surface of the ZD to flow onto the LED or the fluorescent plate or leak out of the dam material.

The swell portion of the dam material reduces the application volume of the light-reflective resin around the ZD, which facilitates coating the ZD.

The ZD is surrounded by the swell portion of the dam material. Therefore, the separation distance between the fluorescent plate and a general portion of the dam material other than the swell portion can be reduced, and the frame dimension of the dam material can be accordingly reduced. This increases the area of the substrate outside the dam material, and makes it easy to provide space for arrangement of an attachment jig (such as a plate spring) for attachment of the substrate to a device. This also reduces the dimensions of the substrate, which is advantageous in terms of cost.

Further, if the light-reflective resin includes a light-reflective resin for a lower layer having a relatively low viscosity before being cured and a light-reflective resin for an upper layer having a relatively high viscosity before being cured, the light-reflective resin for the lower layer with a low viscosity can easily flow into the gaps under the ZD and the LED, and the light-reflective resin for the upper layer which may have a high viscosity can contain a larger amount of a light-reflective substance to provide higher light reflectivity.

(2) The present invention also provides a method for manufacturing a light emitting device including: a substrate; an LED mounted on the substrate; a ZD mounted next to the LED on the substrate; a frame-like dam material formed on the substrate to surround the LED and the ZD; and a light-reflective resin injected inside the dam material to coat side surfaces of the LED and side surfaces and an upper surface of the ZD, the method including:

causing a part of the frame-like dam material to swell outward so as to surround three of the side surfaces of the ZD; and setting a distance between a light output surface and the ZD to be equal to or more than an inside diameter of an opening portion of a dispenser nozzle, and injecting the light-reflective resin from the opening portion of the dispenser nozzle into a space between the light output surface and the side surfaces of the ZD to flow into a gap under the LED and a gap under the ZD so as not to be directly applied to the light output surface and the upper surface of the ZD.

In an aspect, an upper surface of the LED serves as the light output surface. In another aspect, a fluorescent plate is placed on the LED so that an upper surface of the fluorescent plate serves as the light output surface.

In an aspect, a plurality of the LEDs is arranged, and the light-reflective resin is injected while the dispenser nozzle is moved along an arrangement direction of the LEDs.

In an aspect, the light-reflective resin is injected while the dispenser nozzle is moved along the LED, and the dispenser nozzle is moved along a curved path along a swell shape of the part of the dam material such that the dispenser nozzle is moved away from the light output surface and closer to the side surface of the ZD when the dispenser nozzle passes between the light output surface and the ZD.

In an aspect, the light-reflective resin includes a light-reflective resin for a lower layer having a relatively low viscosity and a light-reflective resin for an upper layer having a relatively high viscosity, and the light-reflective resin for the lower layer is injected so that part of the light-reflective resin for the lower layer flows into the gaps, and thereafter, the light-reflective resin for the upper layer is injected.

In a further aspect, the light-reflective resin includes a light-reflective resin for a lower layer having a relatively low viscosity before being cured and a light-reflective resin for an upper layer having a relatively high viscosity before being cured, and the light-reflective resin for the lower layer is injected so that part of the light-reflective resin for the lower layer flows into the gaps, and thereafter, the light-reflective resin for the upper layer is injected.

In an aspect, a vacuum atmosphere is created during or after injection of the light-reflective resin.

According to the present invention, the following effects can be obtained.

The light-reflective resin injected into a space between the light output surface and the side surfaces of the ZD flows in one direction into the gap under the LED and the gap under the ZD to push out air that has been present in such gaps in one direction. Therefore, the air is unlikely to remain as air bubbles, that is, no void is formed.

A larger amount of the light-reflective resin is required in the inside of the swelled part of the dam material which surrounds three of the side surfaces of the ZD than in the inside of the other part of the dam material. Thus, the dispenser nozzle is moved along a curved path along a swell shape of the part of the dam material such that the dispenser nozzle is moved away from the light output surface and closer to the side surface of the ZD when the dispenser nozzle passes between the light output surface and the ZD. This increases the path length of the dispenser nozzle, and increases the amount of injection of the light-reflective resin toward the ZD approached by the dispenser nozzle. Therefore, the inside of the swell part of the dam material can be reliably filled. On the other hand, the amount of injection of the light-reflective resin toward the LED, from which the dispenser nozzle is moved away, is not increased. Therefore, the light-reflective resin does not flow onto the light output surface.

Further, if the light-reflective resin includes a light-reflective resin for a lower layer having a relatively low viscosity and a light-reflective resin for an upper layer having a relatively high viscosity, and the light-reflective resin for the lower layer is injected as described above so that part of the light-reflective resin for the lower layer flows into the gaps, and thereafter, the light-reflective resin for the upper layer is injected as described above, the light-reflective resin for the lower layer with a low viscosity can easily flow into the gaps under the ZD and the LED, and the light-reflective resin for the upper layer which may have a high viscosity can contain a larger amount of a light-reflective substance to provide higher light reflectivity.

In addition, creating a vacuum atmosphere during or after injection of the light-reflective resin allows part of the light-reflective resin to more easily flow into the gaps under the ZD and the LED. Therefore, formation of a void can be more reliably prevented.

Advantageous Effects of Invention

With the light emitting device according to the present invention, advantageously, the upper surface of a ZD can be reliably coated even if a light-reflective resin is injected so as not to be directly applied to the upper surface of the ZD, the light-reflective resin hardly flows onto a fluorescent plate or hardly leaks out of a dam material, and the frame dimension of the dam material can be reduced.

With the method for manufacturing a light emitting device according to the present invention, formation of a void under the ZD can be prevented in the case where the light-reflective resin serves as an underfill for the ZD.

BRIEF DESCRIPTION OF DRAWINGS

FIGS. 1A and 1B illustrate a manufacturing method for a light emitting device according to a first embodiment, in which FIG. 1A is a plan view of a substrate and FIG. 1B is a plan view with LEDs and a ZD mounted;

FIGS. 2C and 2D illustrate the method for manufacturing a light emitting device according to the first embodiment, in which FIG. 2C is a plan view with a dam material formed and FIG. 2D is a plan view in the middle of injection of a light-reflective resin;

FIGS. 3E and 3F illustrate the method for manufacturing a light emitting device according to the first embodiment, in which FIG. 3E is a plan view with injection of the light-reflective resin having progressed and FIG. 3F is a plan view with injection of the light-reflective resin finished;

FIG. 5 is a perspective view illustrating an essential portion in the middle of injection of the light-reflective resin;

FIGS. 9A and 9B illustrate a method for manufacturing a light emitting device according to a sixth embodiment, in which FIG. 9A is a plan view illustrating a step of injecting a light-reflective resin and FIG. 9B is an enlarged plan view illustrating an essential portion;

FIGS. 10C and 10D illustrate the method for manufacturing a light emitting device according to the sixth embodiment, in which FIG. 10C is a plan view in the middle of injection of a light-reflective resin, and FIG. 10D is a plan view with injection of the light-reflective resin having progressed;

FIG. 12 is a plan view illustrating a method for manufacturing a light emitting device according to a seventh embodiment;

FIGS. 13A and 13B illustrate a light emitting device according to an eighth embodiment, in which FIG. 13A is a sectional view with a light-reflective resin for a lower layer injected and FIG. 13B is a sectional view with a light-reflective resin for an upper layer injected; and FIGS. 14A and 14B illustrate a light emitting device according to the related art, in which FIG. 14A is a plan view with a dam material formed and FIG. 14B is a plan view with a light-reflective resin injected.

DESCRIPTION OF EMBODIMENTS

1. Substrate

Figure 1A:
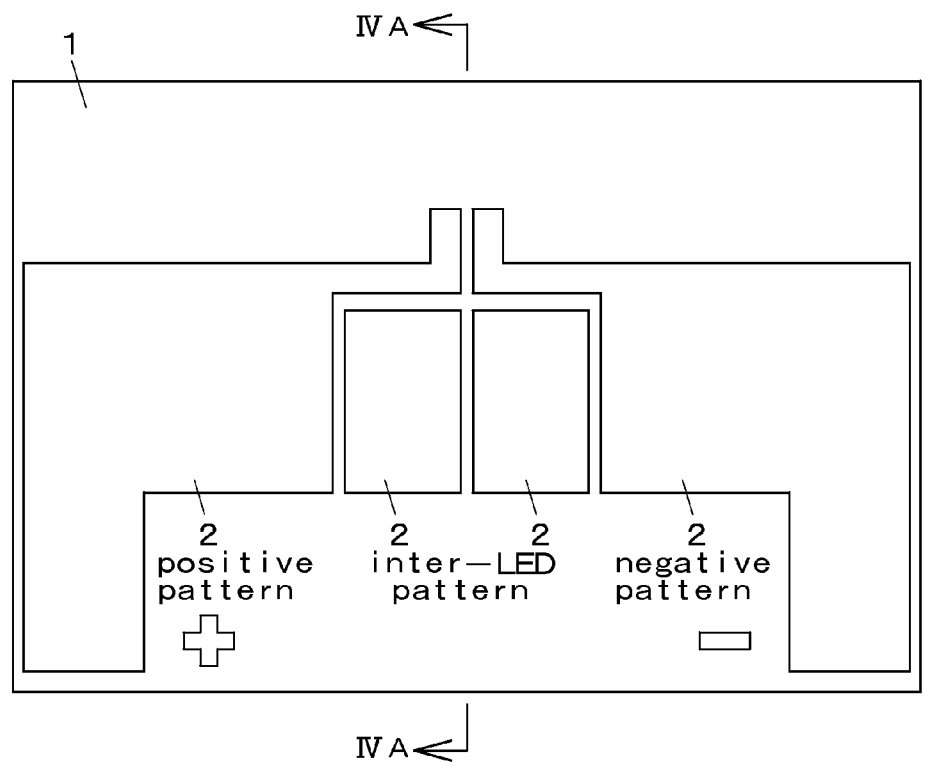

The material of the substrate is not specifically limited. Examples of the material include a ceramic, a resin, and a metal with an insulating coating on the surface. Examples of the ceramic include aluminum nitride (AlN) and alumina.

The shape of the substrate is not specifically limited. Examples of the shape include a rectangular shape, a circular shape, and a triangular shape.

The material of the wiring patterns is not specifically limited. Examples of the material include gold, silver, copper, and aluminum.

2. LED

The color of light emitted by the LEDs is not specifically limited, but is preferably blue, violet, or ultraviolet light that can be synthesized with fluorescent light when a fluorescent substance is excited to take out white light.

The material of the semiconductor layer of the LEDs is not specifically limited. Examples of the material include gallium nitride (GaN), zinc oxide (ZnO), zinc selenide (ZnSe), and silicon carbide (SiC).

The means for bonding the LEDs to the wiring patterns is not specifically limited. Examples of the means include flip-chip mounting through a bump, solder, conductive paste, metal fine particles, surface activation, or the like, and bonding through an adhesive or the like. Examples of the bump include a stud bump, a linear bump, and a solder bump. Examples of the material of the bump include gold (Au), copper (Cu), and a silver-tin alloy (Ag/Sn). Examples of the material of the solder include a gold-tin alloy (Au/Sn).

The number of the LEDs to be mounted is not specifically limited. The number of the LEDs may be one to 20, for example. Multiple LEDs are preferably arranged with a predetermined inter-chip distance therebetween. The number of rows of the LEDs is not specifically limited. The number of rows of the LEDs may be one to three, for example.

3. Fluorescent Substance

In the case where white light is taken out of the light emitting device, fluorescent substances may be used, although not essential. A fluorescent substance that emits light in a fluorescent color or fluorescent substances that emits light in different colors may be synthesized with light emitted by the LEDs to take out white light. For example, in the case where blue LEDs are used, a yellow fluorescent substance may be used singly, or a red fluorescent substance and a green fluorescent substance may be used in combination.

The fluorescent substance may be provided in the form of a fluorescent plate, for example, and may be provided over the upper surfaces of the LEDs. The fluorescent plate is a translucent plate containing a fluorescent substance, and is not specifically limited. Examples of the fluorescent plate include a monocrystalline body of a fluorescent substance, a polycrystalline body of a fluorescent substance, a sintered body of a fluorescent substance, and a resin or glass with a fluorescent substance dispersed therein or applied thereto.

In the case where multiple LEDs are mounted, the fluorescent plate may be multiple pieces each sized to cover the upper surface of the corresponding LED, or may be a single piece sized to collectively cover the upper surfaces of all the LEDs. The former configuration is preferable. In the latter configuration, the distance between the LEDs and the fluorescent plate is fluctuated because of fluctuations caused when the LEDs are bonded to the wiring patterns. As a result, the LEDs and the fluorescent plate may be fluctuated in optical and thermal characteristics, which may cause non-uniform light emission as a whole.

In the case where a fluorescent plate is used, the LEDs are preferably face-down LEDs mounted through flip-chip mounting, for example.

4. Dam Material

The material of the dam material is not specifically limited. Examples of the material include a resin. The resin is not specifically limited. Examples of the resin include a silicone resin, an epoxy resin, and an acrylic resin. The resin is preferably of the same type as the resin for the light-reflective resin in order that the light-reflective resin easily rises along the dam material and adheres well to the dam material. The resin for the dam material may also contain a light-reflective substance.

The frame shape of the dam material is not specifically limited. Examples of the frame shape include a rectangular frame shape, an oval frame shape, an elliptical frame shape, and a circular frame shape.

The swell shape of a part of the dam material is not specifically limited. Examples of the swell shape of a part of the dam material include a semi-circular shape, a V shape, and an angular U shape.

5. Light-Reflective Resin

The light-reflective resin is not specifically limited. Examples of the light-reflective resin include a resin containing a light-reflective substance.

The resin is not specifically limited. Examples of the resin include a silicone resin, an epoxy resin, and an acrylic resin.

The light-reflective substance is not specifically limited. Examples of the light-reflective substance include oxides of substances such as Ti, Zr, Nb, Al, and Si, AlN, and MgF.

6. Usage

The usage of the light emitting device according to the present invention is not specifically limited. Examples of the usage include headlights for various conveyances such as automobiles, trains, ships, and aircrafts, floodlights, and general illumination devices.

First Embodiment

A first embodiment in which the present invention is applied to a light emitting device used as a light source for a headlight for an automobile will be described below with reference to FIGS. 1A to 6.

The light emitting device includes: a substrate 1, on the upper surface of which wiring patterns 2 are provided with a predetermined clearance therebetween; LEDs 3 each mounted on two of the wiring patterns 2 to emit blue light; translucent fluorescent plates 4 containing a fluorescent substance and placed on and bonded to the upper surfaces of the LEDs 3; a ZD 5 serving as a protective element for the LEDs 3 and mounted next to the LEDs 3 on the two wiring patterns 2 with a predetermined clearance therebetween; a frame-like dam material 6 formed on the substrate 1 to surround the LEDs 3 and the ZD 5; and a light-reflective resin 7 injected inside the dam material 6 to coat the side surfaces of the LEDs 3 and the side surfaces of the fluorescent plates 4 and coat the side surfaces and the upper surface of the ZD 5.

The substrate 1 is a flat plate having a rectangular shape as viewed in plan, for example, and made of a metal with good heat resistance and weather resistance such as AlN. The wiring patterns 2 include a positive pattern, a negative pattern, and inter-LED patterns. A predetermined clearance is provided between such patterns. The clearance forms a gap between the lower surfaces of the LEDs 3 and the substrate 1, and forms a gap between the lower surface of the ZD 5 and the substrate 1.

The LEDs 3 are face-down blue LEDs 3 having a rectangular shape as viewed in plan, and are mounted on the wiring patterns 2 through flip-chip mounting by linear bumps 8 made of Au. The linear bumps 8 support the LEDs 3 in a slightly lifted position, and thus form a gap between portions of the lower surfaces of the LEDs 3 where no linear bumps are provided and the wiring patterns 2. Three LEDs 3, for example, are arranged in one row with a predetermined inter-chip clearance therebetween, and mounted to lie over the positive pattern, the inter-LED 3 patterns, and the negative pattern of the wiring patterns 2 so as to be connected in series with each other, for example.

The fluorescent plates 4 are each a flat plate having a rectangular shape as viewed in plan and being slightly larger than the upper surface of each of the LEDs 3, and are each bonded to the upper surface of each of the LEDs 3 with an adhesive. The three fluorescent plates 4 are disposed in one row with a predetermined inter-plate clearance therebetween. The fluorescent plates 4 contain a fluorescent substance that emits yellow fluorescent light when excited by blue light emitted by the LEDs 3, and are translucent. The upper surfaces of the fluorescent plates 4 serve as light output surfaces for white light synthesized from the blue light emitted by the LEDs 3 and the yellow light emitted by the fluorescent substance.

In the embodiment, one ZD 5 is disposed at a side of a center portion of the three LEDs 3 in the arrangement direction of the LEDs 3 at a first distance D1 (see FIG. 2C) from the upper surfaces (light output surfaces) of the fluorescent plates 4, and mounted on the positive pattern and the negative pattern by stud bumps 9 made of Au. The first distance D1 is equal to or more than the inside diameter (0.18 mm) of the opening portion of a dispenser nozzle 10 to be discussed later, and is 0.4 to 0.9 mm, for example. The ZD 5 is intended to protect the LEDs 3 from electrostatic breakdown, and mounted in parallel with and in the opposite direction in polarity to the LEDs 3. The stud bumps 9 support the ZD 5 in a slightly lifted position, and thus form a gap between a portion of the lower surface of the ZD 5 where no stud bumps are provided and the wiring patterns 2.

The dam material 6 is formed by placing a silicone resin, for example, in the shape of a projecting streak on the substrate 1. A main portion (a portion other than the part described next) of the dam material 6 is formed to have a rectangular frame shape that is somewhat larger than the upper surfaces (light output surfaces) of the fluorescent plates 4 as viewed in plan, with a second distance D2 therefrom. Apart (a center portion of one of the long sides) of the dam material 6 is formed in an outwardly swelled semi-circular shape, for example, and surrounds three of the side surfaces of the ZD 5, excluding one side surface that faces the LEDs 3, at a third distance D3 therefrom. The second distance D2 is equal to or more than the inside diameter (0.18 mm) of the opening portion of a dispenser nozzle 10 to be discussed later, and is 0.4 to 0.8 mm, for example. The third distance D3 is 0.15 to 0.6 mm, for example. In order to obtain sufficient light reflectivity, the second distance D2 is preferably large. In order to reduce the frame dimension of the dam material 6, the third distance D3 is preferably small. If D2 is larger than D3, D2 and D3 are well-balanced. If D1 and D2 are about the same as each other, the dispenser nozzle 10 can be disposed in this space, which enables stable resin injection between the dam material and the chips and between the chips.

The height of the dam material 6 is larger than the height of the upper surface of the ZD 5, and less than the height of the upper surfaces of the fluorescent plates 4.

The light-reflective resin 7 is formed by injecting a silicone resin, for example, containing titanium oxide ($TiO_2$) as a light-reflective substance inside the dam material 6 and thereafter curing the silicone resin.

A first object and function of the light-reflective resin 7 is to reflect and block light output from the side surfaces of the LEDs 3 and the side surfaces of the fluorescent plates 4. Thus, the light-reflective resin 7 coats the side surfaces of the LEDs 3 and the side surfaces of the fluorescent plates 4 (and also fills the inter-chip clearances and the inter-plate clearances), and leaves the upper surfaces of the fluorescent plates 4 serving as light output surfaces exposed.

A second object and function of the light-reflective resin 7 is to protect the ZD 5 from external humidity or the like. Thus, the light-reflective resin 7 coats the side surfaces and the upper surface of the ZD 5.

A third object and function of the light-reflective resin 7 is to function as an underfill. Thus, the light-reflective resin 7 also flows into the gaps under the LEDs 3 and the ZD 5 discussed above (clearances between the wiring patterns 2 and gaps between the chips and the wiring patterns 2) to serve as underfills 7a and 7b, which establishes a state in which no void is provided in such gaps.

The upper surface of the light-reflective resin 7 is higher around the upper end portion of the side surfaces of the fluorescent plates 4 and around the upper end portion of the inner side surfaces of the dam material 6, and slightly lower therebetween, forming a concave shape.

The blue light emitted from the LEDs 3 is exclusively output from the upper surfaces to enter the fluorescent plate 4 with components directed transversely from the side surfaces reflected and blocked by the light-reflective resin 7 and with components directed downward from the lower surfaces reflected and blocked by the wiring patterns 2. The blue light and fluorescent light emitted when the fluorescent substance contained in the fluorescent plate 4 is excited by the blue light are synthesized, so that white light is output from the upper surfaces of the fluorescent plates 4.

A method for manufacturing the light emitting device configured as described above will be described in the order of steps.

Figure 1B:
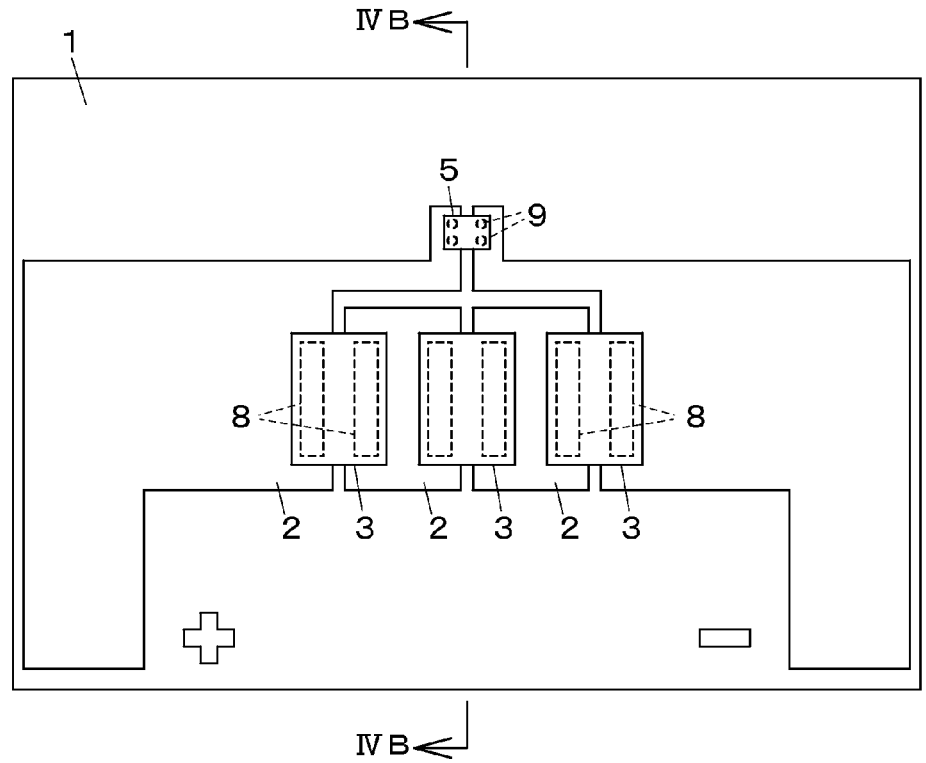
Figure 4A:
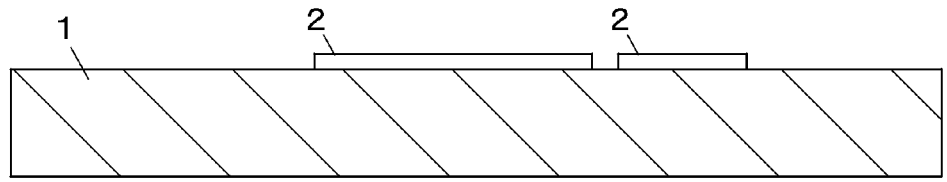
FIGS. 4A to 4F are sectional views taken along respective section indication lines of FIGS. 1A to 3F.
Figure 4B:
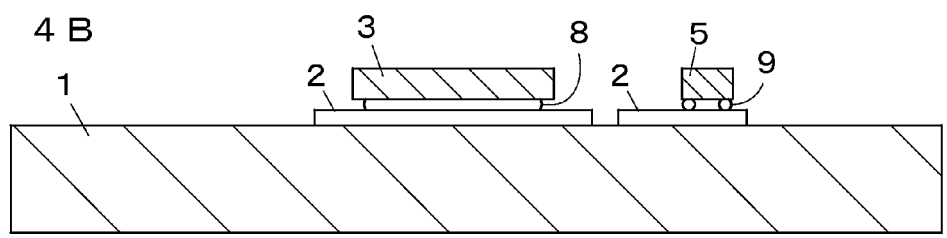

(1) As illustrated in FIGS. 1B and 4B, LEDs 3 and a ZD 5 are bonded by bumps onto wiring patterns 2 on a substrate 1 illustrated in FIGS. 1A and 4A. At this time, gaps (clearances between the wiring patterns 2 and gaps between the chips and the wiring patterns 2) are created under the chips.

Figure 2C:
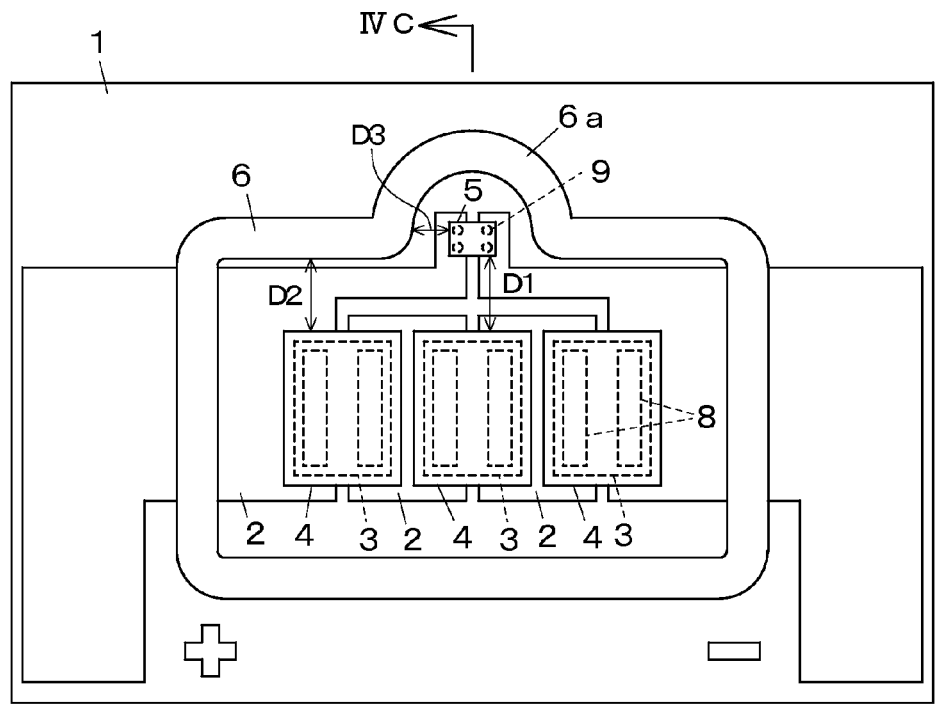
Figure 4C:
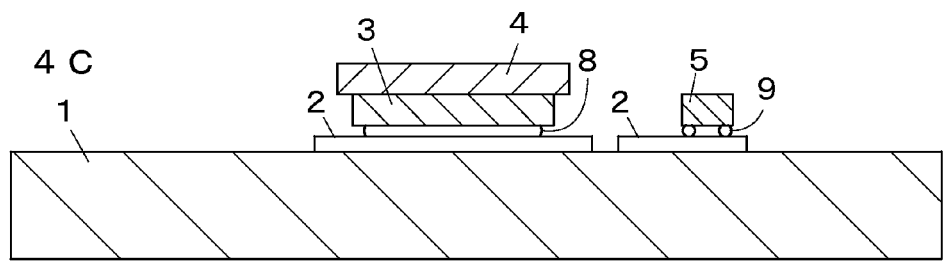

(2) As illustrated in FIGS. 2C and 4C, fluorescent plates 4 are placed on and bonded to the LEDs 3 with an adhesive or the like. In addition, a dam material 6 is applied and formed such that a part of the dam material 6 surrounds three of the side surfaces of the ZD 5. The dam material 6 is partially or completely cured before injection of a light-reflective resin 7 to be discussed later. It should be noted, however, that in the case where the dam material 6 is so viscous that the dam material 6 is not deformed even if a light-reflective resin 7 is injected, the dam material 6 may be cured at the same time as the light-reflective resin 7.

Figure 2D:
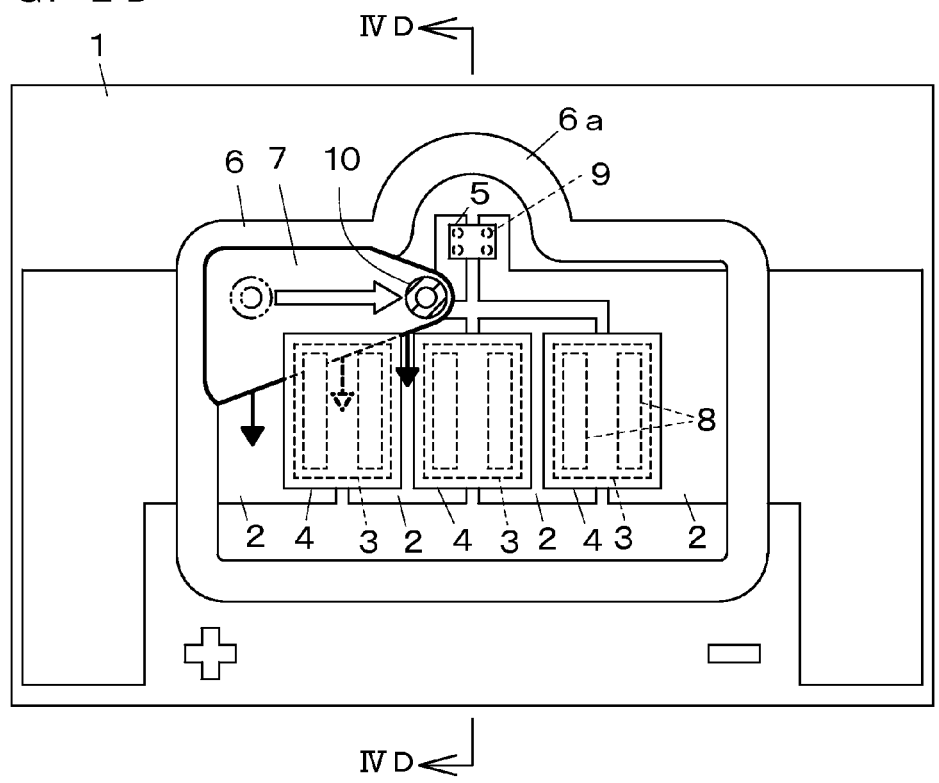
Figure 4D:
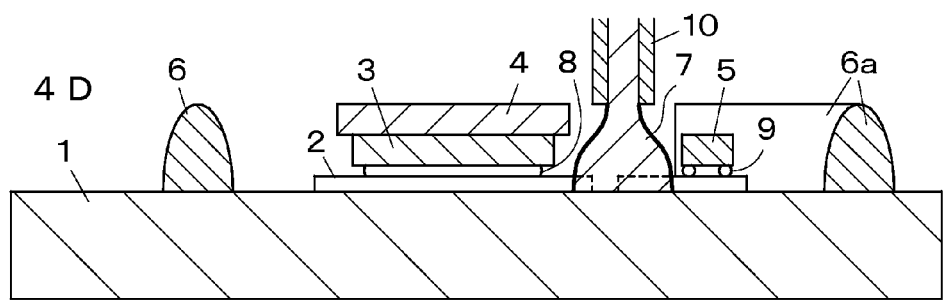

(3) As illustrated in FIGS. 2D and 4D, the light-reflective resin 7 is injected to a location (hereinafter referred to as an "injection location") between side surfaces of the arranged fluorescent plates 4 facing the ZD 5 and the side surfaces of the dam material 6 and the ZD 5 such that the light-reflective resin 7 is not directly applied to the upper surfaces of the LEDs 3 and the upper surfaces of the ZD 5. To this end, first, the opening portion of the dispenser nozzle 10 is positioned above one end of the injection location as indicated by the chain double-dashed lines in FIG. 2D. Subsequently, the light-reflective resin 7 is discharged from the opening portion while the dispenser nozzle 10 is moved along the arrangement direction of the LEDs 3 as indicated by the white arrow.

Figure 3E:
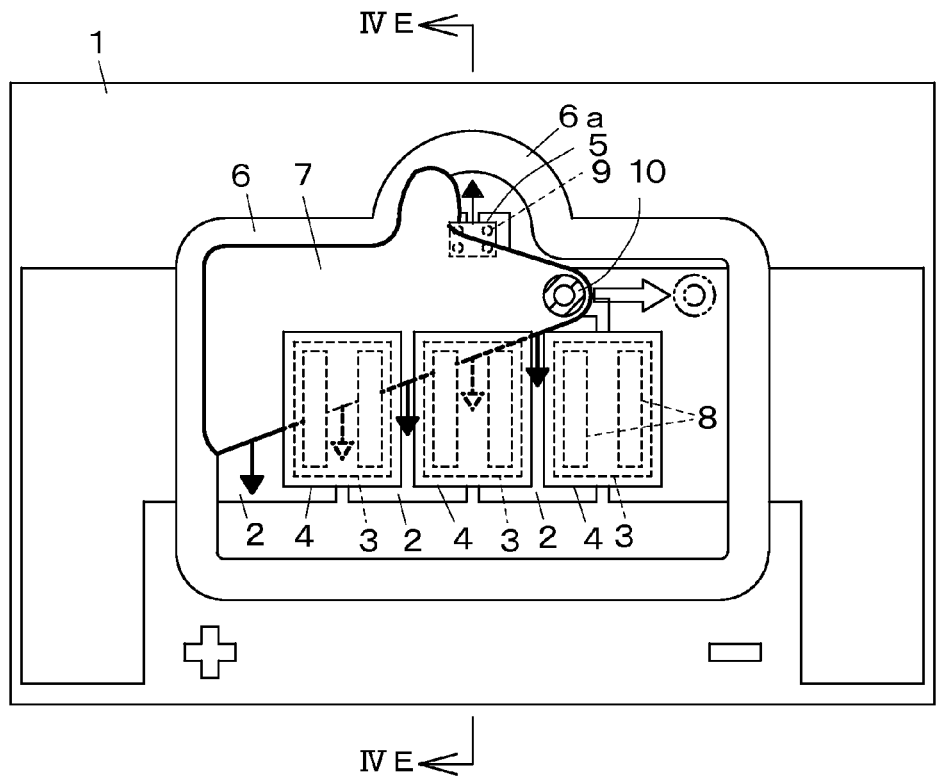
Figure 4E:
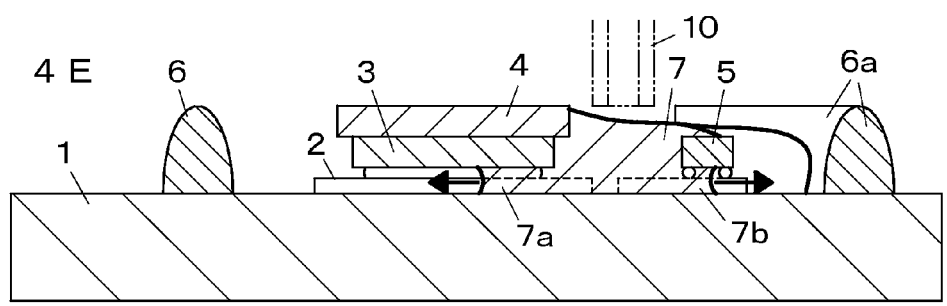

FIGS. 3E and 4E illustrate a state in which the dispenser nozzle 10 has been further moved, and the dispenser nozzle 10 is moved to a location above the other end of the injection location indicated by the chain double-dashed lines in the upper portion of FIG. 3E. FIG. 5 illustrates a state in which the dispenser nozzle 10 is around the ZD 5 in the middle of the movement. Any desired application direction may be selected as long as the light-reflective resin 7 can be injected from one side.

The thus injected light-reflective resin 7 fills the injection location, and flows in two directions that cross the arrangement direction of the LEDs 3, toward the LED 3 and toward the ZD 5, as follows:

(i) Toward the LED 3, the light-reflective resin 7 flows in one direction through a space between an end side surface of the LED 3 on one end side and the dam material 6 to fill the space, and also flows in one direction through the clearances between the LEDs 3 to fill the clearances.

Further, the light-reflective resin 7 flows in one direction into the gaps under the LEDs 3 to serve as the underfill 7a. In particular, air tends to be trapped in the gaps under the LEDs 3. The light-reflective resin 7 flows in one direction from one side to fill the gaps, which pushes out air as indicated by the arrows in FIG. 5. Therefore, the air does not remain as air bubbles, that is, no void is formed.

In addition, the light-reflective resin 7 is injected so as not to be directly applied to the upper surface of the ZD 5, and a large clearance is provided between the ZD 5 and the fluorescent plates 4. Consequently, it is possible to prevent the light-reflective resin 7 from flowing onto the fluorescent plates 4.

(ii) Toward the ZD 5, the light-reflective resin 7 flows into a space between the ZD 5 and a swell portion 6a of the dam material 6 that surrounds three of the side surfaces of the ZD 5 to fill the space. The light-reflective resin 7 flows along both the side surfaces of the ZD 5 and the inner side surface of the dam material 6, which tends to increase the height of the light-reflective resin 7. Since the light-reflective resin 7 rises up to the upper surface of the ZD 5 from all of the three side surfaces of the ZD 5, the side surfaces and the upper surface of the ZD 5 are reliably coated. In the case where the dam material 6 is not provided with such a swell portion 6a, the light-reflective resin 7 rises from one of the side surfaces of the ZD 5 facing the dam material 6. Therefore, it is highly likely that a portion of the upper surface of the ZD 5 close to the LEDs 3 cannot be coated but is exposed.

Further, the light-reflective resin 7 flows in one direction into the gap under the ZD 5 to serve as the underfill 7b. In particular, air tends to be trapped in the gap under the ZD 5. The light-reflective resin 7 flows in one direction from one side to fill the gap, which pushes out air. Therefore, the air does not remain as air bubbles, that is, no void is formed.

By injecting the light-reflective resin 7 so as not to be directly applied to the upper surface of the ZD 5, in addition, it is possible to prevent the light-reflective resin 7 from flowing onto the dam material 6 to further leak out of the dam material 6.

It can be confirmed that the clearances between the chips and the gaps under the chips are filled with the light-reflective resin 7 by observing if the light-reflective resin 7 flows to the opposite side, which allows reliable filling. Also after the confirmation, the light-reflective resin 7 further flows to a location (hereinafter referred to as an "opposite location") between side surfaces of the arranged fluorescent plates 4 opposite to the side surfaces facing the ZD 5 and the dam material 6 to fill the location. It should be noted, however, that when the opposite location cannot be sufficiently filled with the thus flowing light-reflective resin 7, the opposite location can also be filled while the dispenser nozzle 10 is moved along the arrangement direction of the LEDs 3 in the same manner as described above as indicated by the arrow in FIG. 3F after the confirmation described above. By moving the dispenser nozzle 10 in the same direction (from the left to the right) as in the light-reflective resin injection process described above as illustrated in FIG. 3F, it is possible to prevent air from being trapped while the light-reflective resin 7 is flowing into the gaps between and under the chips to fill the gaps due to the light-reflective resin 7 injected from the opposite side (opposite location) (the light-reflective resin 7 is given more time to flow).

Figure 3F:
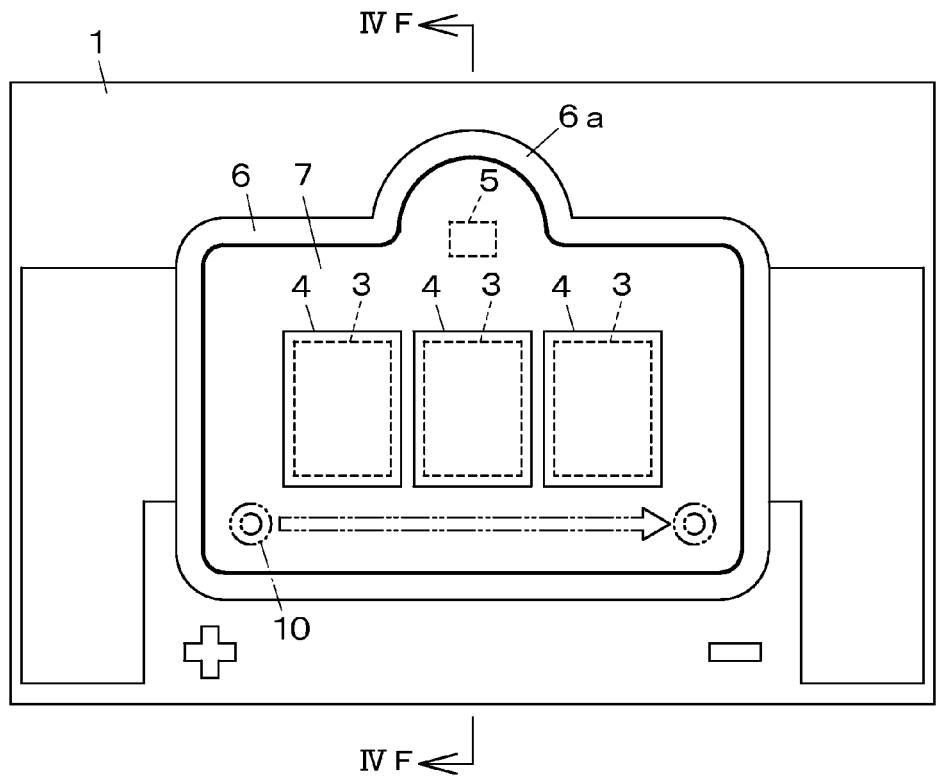
Figure 4F:
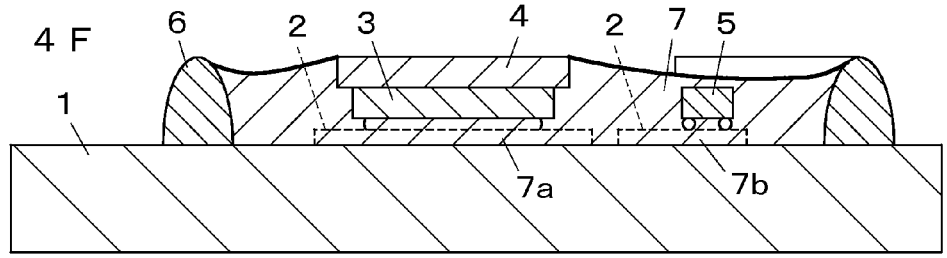
Figure 6:
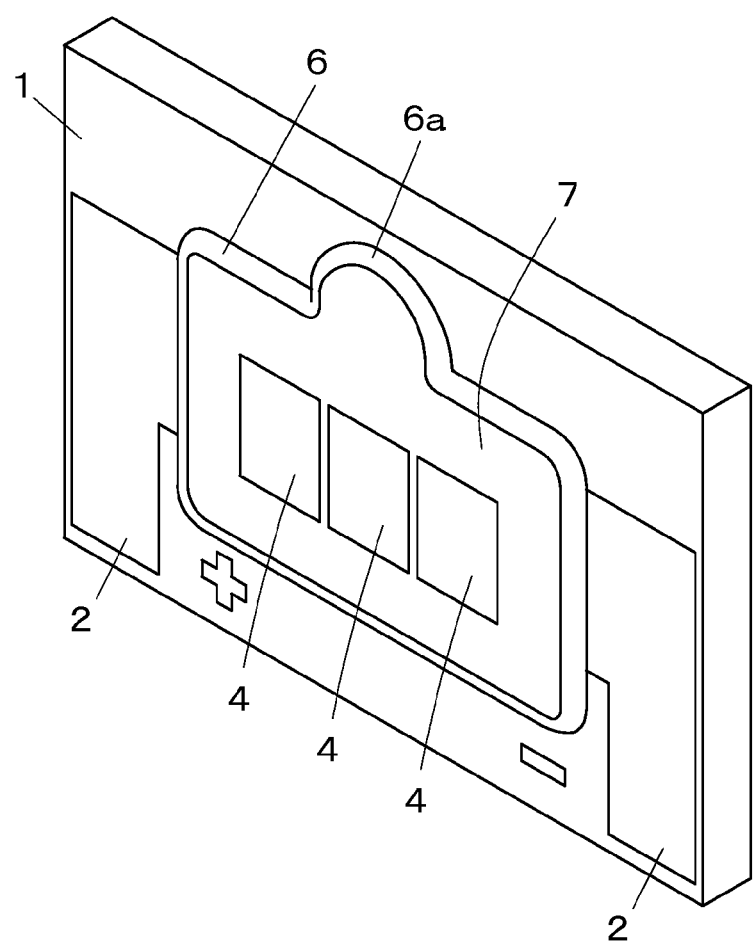
FIG. 6 is a perspective view of a manufactured light emitting device.

(4) As illustrated in FIGS. 3F and 4F, a light emitting device (LED 3 package) is completed by curing the light-reflective resin 7 after the inside of the dam material 6 is completely filled with the light-reflective resin 7.

Second Embodiment

Figure 7A:
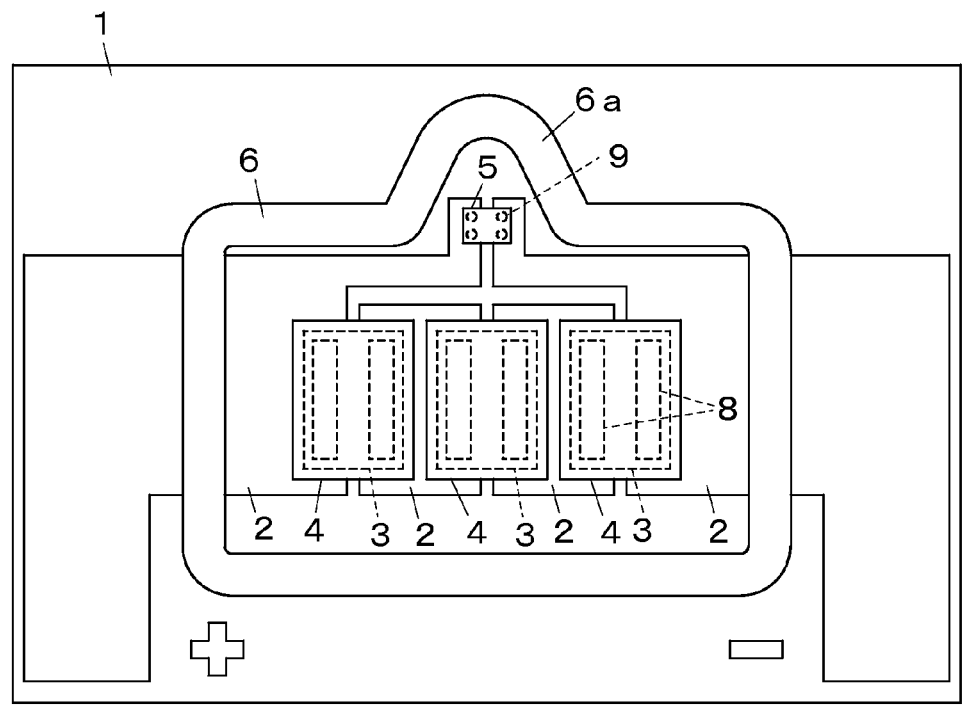
FIG. 7A is a plan view in which a dam material is formed in a light emitting device according to a second embodiment.

A light emitting device according to a second embodiment is different from that according to the first embodiment only in that, as illustrated in FIG. 7A which illustrates a state before injection of the light-reflective resin 7, apart (a center portion of one of the long sides) of the dam material 6 is formed in an outwardly swelled V shape and surrounds three of the side surfaces of the ZD 5 at a third distance therefrom. The embodiment is otherwise the same as the first embodiment, and the light-reflective resin 7 is injected in the same manner as in the first embodiment.

Third Embodiment

Figure 7B:
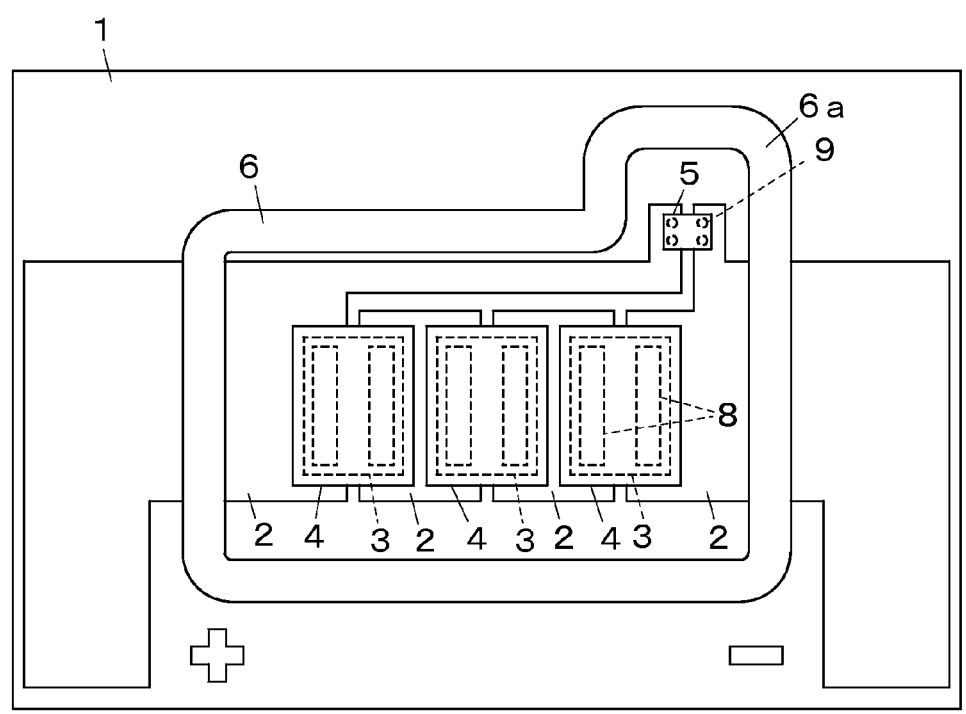
FIG. 7B is a plan view in which a dam material is formed in a light emitting device according to a third embodiment.

A light emitting device according to a third embodiment is different from that according to the first embodiment only in that, as illustrated in FIG. 7B which illustrates a state before injection of the light-reflective resin 7, a part (one end portion of one of the long sides) of the dam material 6 is formed in an outwardly swelled angular U shape and surrounds three of the side surfaces of the ZD 5 at a third distance therefrom. The embodiment is otherwise the same as the first embodiment, and the light-reflective resin 7 is injected in the same manner as in the first embodiment.

Fourth Embodiment

Figure 8A:
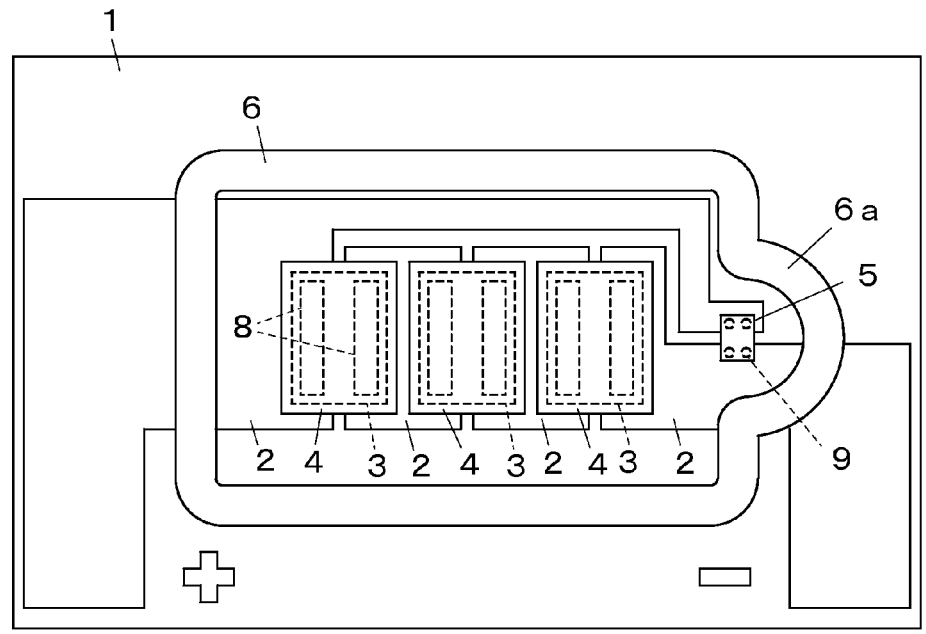
FIG. 8A is a plan view in which a dam material is formed in a light emitting device according to a fourth embodiment.

A light emitting device according to a fourth embodiment is different from that according to the first embodiment only in that, as illustrated in FIG. 8A which illustrates a state before injection of the light-reflective resin 7, apart (a center portion of one of the short sides) of the dam material 6 is formed in an outwardly swelled V shape and surrounds three of the side surfaces of the ZD 5 at a third distance therefrom. The embodiment is otherwise the same as the first embodiment, and the light-reflective resin 7 is injected in the same manner as in the first embodiment.

Fifth Embodiment

Figure 8B:
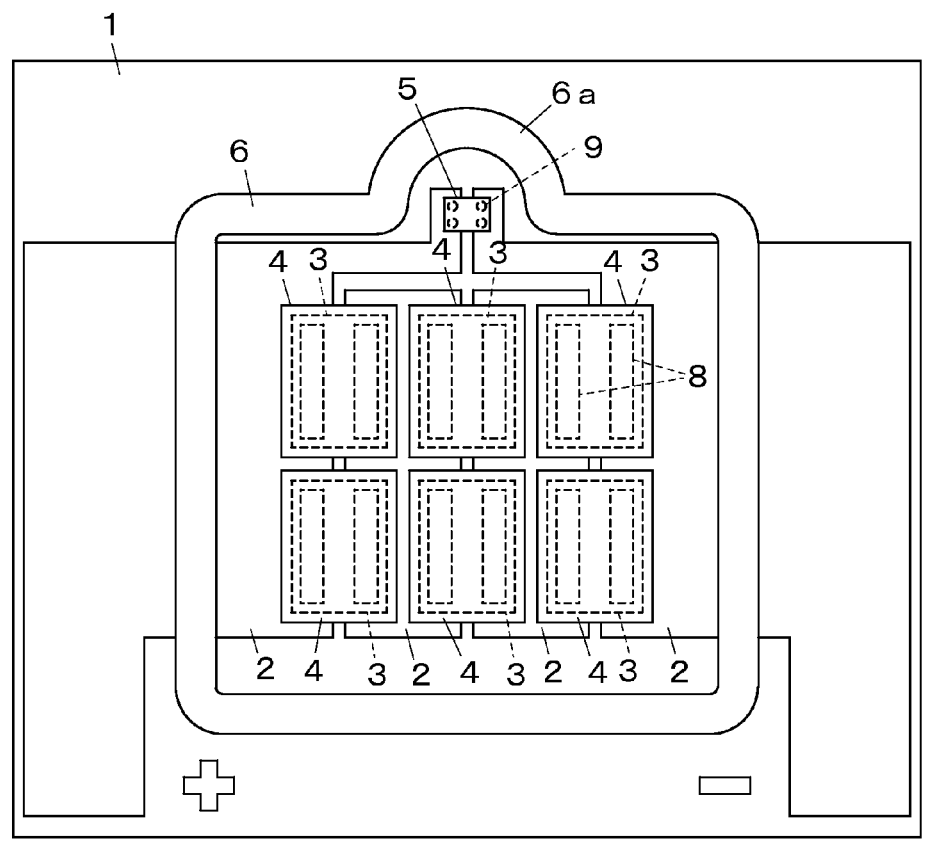
FIG. 8B is a plan view in which a dam material is formed in a light emitting device according to a fifth embodiment.

A light emitting device according to a fifth embodiment is different from that according to the first embodiment only in that, as illustrated in FIG. 8B which illustrates a state before injection of the light-reflective resin 7, six LEDs 3 are arranged in two rows and the fluorescent plates 4 are also arranged in the same manner. The embodiment is otherwise the same as the first embodiment, and the light-reflective resin 7 is injected in the same manner as in the first embodiment.

According to the second to fifth embodiments as well, the same functions and effects as those of the first embodiment can be obtained.

Sixth Embodiment

A light emitting device according to a sixth embodiment illustrated in FIGS. 9A to 11B is different from that according to the first embodiment only in that the light-reflective resin injection process in the manufacturing method is changed. The embodiment is otherwise the same as the first embodiment.

A larger amount of the light-reflective resin 7 is required in the inside of the swell portion 6a of the dam material 6 discussed above than in the inside of the dam material 6 formed in a straight shape.

In the first embodiment, in the light-reflective resin 7 injection process (step (3) described in the paragraphs [0041] to [0044]), the dispenser nozzle 10 is moved linearly. If the movement of the dispenser nozzle 10 is temporarily stopped to increase the amount of injection of the light-reflective resin 7 in the vicinity of the swell portion 6a, the light-reflective resin 7 may be raised to flow onto the upper surfaces (light output surfaces) of the fluorescent plates 4.

Thus, in the sixth embodiment, the dispenser nozzle 10 is moved along a curved path along the shape of the swell portion 6a of the dam material 6 when the dispenser nozzle 10 passes between the upper surfaces (light output surfaces) of the fluorescent plates 4 and the ZD 5. Specifically, a part of step (3) of the first embodiment is changed as follows.

In FIGS. 9 and 10, the moving track of the opening portion of the dispenser nozzle 10 is indicated by the chain double-dashed lines.

As illustrated in FIGS. 9A to 10C, in the same manner as in the first embodiment, the opening portion of the dispenser nozzle 10 is positioned above one end (in the drawings, the left end) of the injection location, and the light-reflective resin 7 is discharged from the opening portion to be injected while the dispenser nozzle 10 is moved along the arrangement direction of the LEDs 3 as indicated by the white arrow. At this time, between the fluorescent plates 4 and the main portion of the dam material 6, as illustrated in FIGS. 9B and 11A, the distance from the fluorescent plates 4 to the center of the opening portion of the dispenser nozzle 10 is preferably equal to or more than 0.5 times and equal to or less than 0.7 times (for example, 0.6 times) the second distance D2 (the distance from the fluorescent plates 4 to the main portion of the dam material 6). This is because the light-reflective resin 7 does not easily flow onto the upper surfaces of the fluorescent plates 4 if the dispenser nozzle 10 is located at the center, or slightly closer to the dam material 6, between the fluorescent plates 4 and the dam material 6.

When the dispenser nozzle 10 passes between the fluorescent plates 4 and the ZD 5, the light-reflective resin 7 is discharged to be injected while the dispenser nozzle 10 is moved along a curved path along the shape of the swell portion 6a of the dam material 6 such that the dispenser nozzle 10 is moved away from the upper surface of the fluorescent plate 4 and closer to the side surface of the ZD 5.

Figure 11A:
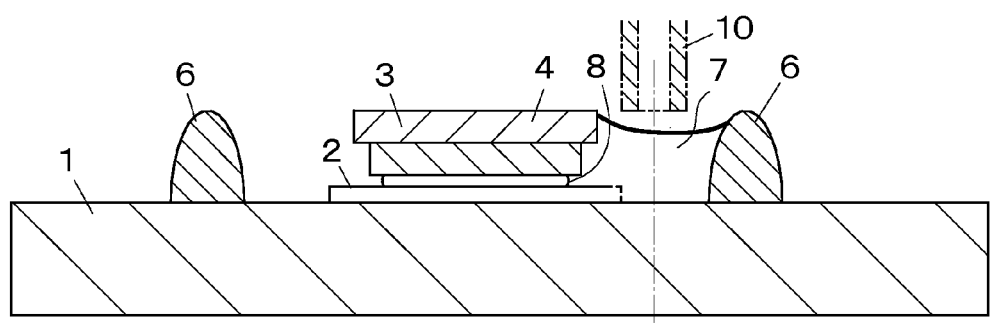
FIGS. 11A and 11B are sectional views taken along respective section indication lines of FIG. 10C.
Figure 11B:
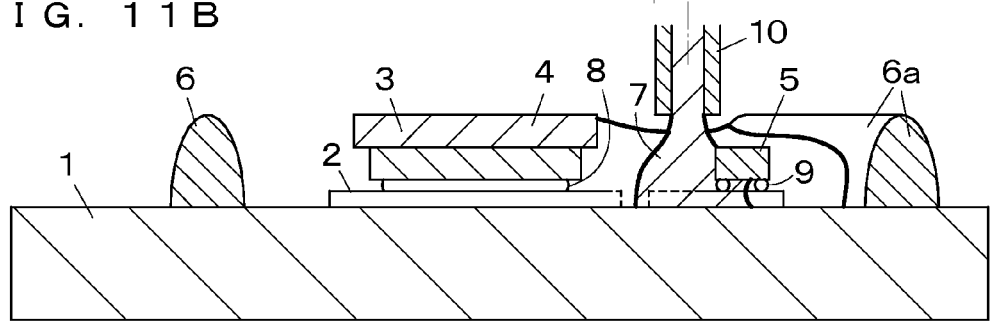

Moving the dispenser nozzle 10 along a curved path in this way increases the path length of the dispenser nozzle 10, and increases the amount of injection of the light-reflective resin 7 toward the ZD 5 approached by the dispenser nozzle 10 as illustrated in FIG. 11B. Therefore, the inside of the swell portion 6a of the dam material 6 can be reliably filled. On the other hand, the amount of injection of the light-reflective resin 7 toward the LEDs 3, from which the dispenser nozzle 10 is moved away, is not increased. Therefore, the light-reflective resin 7 does not flow onto the upper surfaces of the fluorescent plates 4.

Figure 9A:
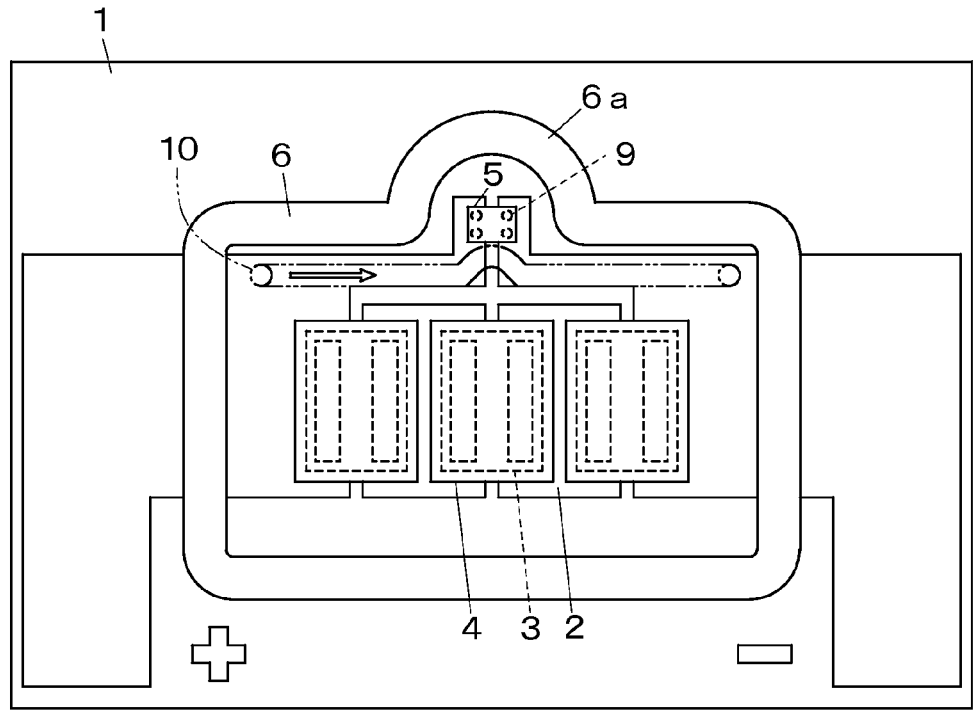
Figure 9B:
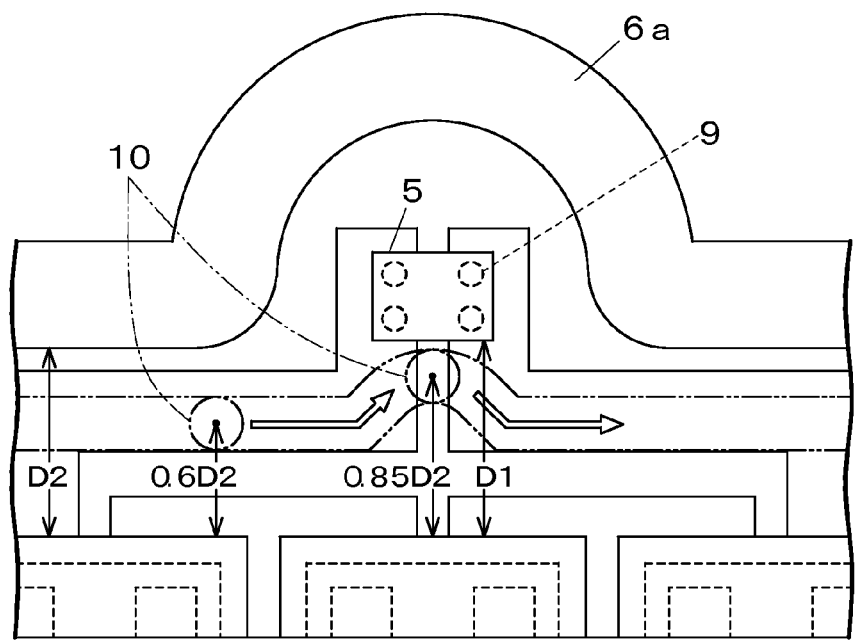

In order to more reliably obtain such functions and effects, the distance from the fluorescent plates 4 to the center of the opening portion of the dispenser nozzle 10 when the dispenser nozzle 10 is located closest to the side surface of the ZD 5 is preferably more than 0.7 times and equal to or less than 0.95 times (for example, 0.85 times) the second distance D2 (the distance from the fluorescent plates 4 to the main portion of the dam material 6) as illustrated in FIGS. 9B and 11B. In addition, the edge of the opening portion of the dispenser nozzle 10 preferably narrowly does not overlap the side surface of the ZD 5.

Figure 10C:
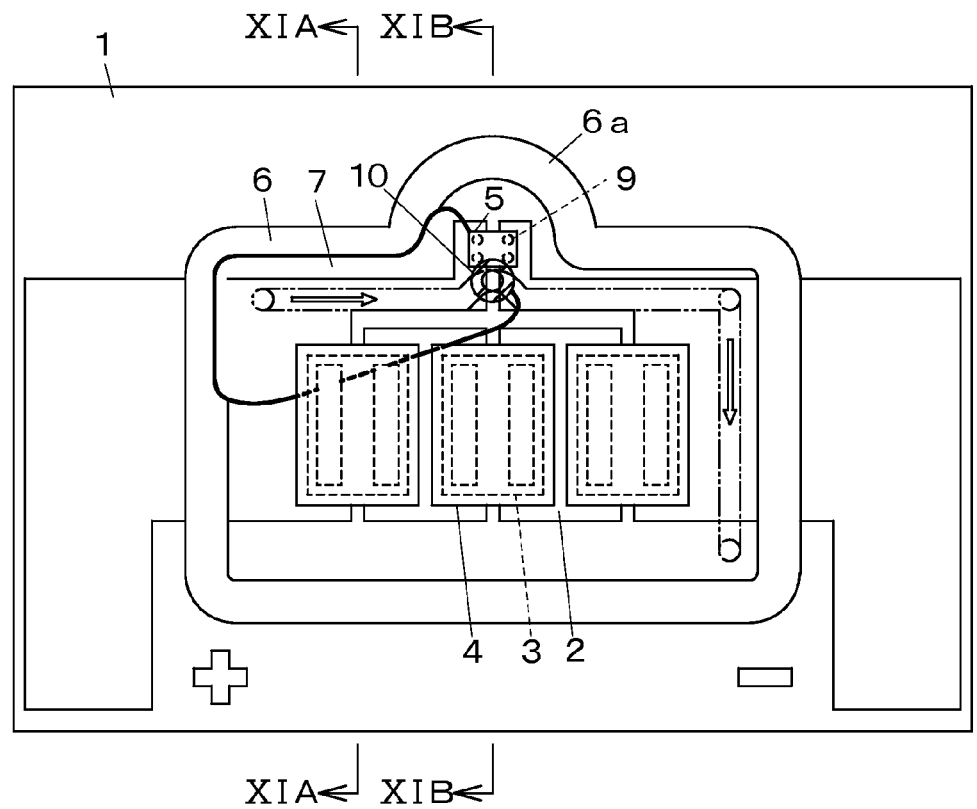
Figure 10D:
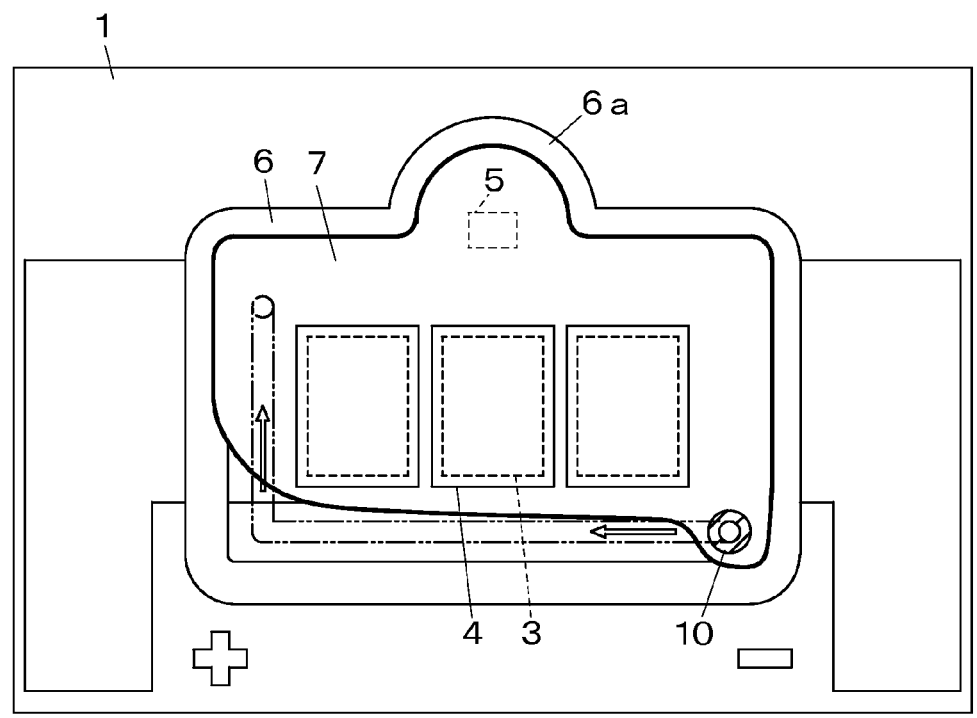

After that, when the opening portion of the dispenser nozzle 10 is moved to the other end (in the drawings, the right end) of the injection location, the dispenser nozzle 10 is subsequently moved in the direction orthogonal to the arrangement direction of the LEDs 3 between the LED 3 at the right end and the dam material 6 as illustrated in FIG. 10C. When the dispenser nozzle 10 is moved to the right end of the opposite location, the dispenser nozzle 10 is subsequently moved along the arrangement direction of the LEDs 3 at the opposite location as illustrated in FIG. 10D. When the dispenser nozzle 10 is moved to the left end, the dispenser nozzle 10 is moved in the direction orthogonal to the arrangement direction of the LEDs 3 between the LED 3 at the left end and the dam material 6. During such movement, the light-reflective resin 7 is discharged to be injected. As in the first embodiment, when the light-reflective resin 7 is injected while the dispenser nozzle 10 is moved at the opposite location, the clearances between the chips and the gaps under the chips are already filled with the light-reflective resin 7, and therefore no void is formed.

In addition, creating a vacuum atmosphere during or after injection of the light-reflective resin 7 allows part of the light-reflective resin 7 to more easily flow into the gaps. Therefore, formation of a void can be more reliably prevented.

According to the sixth embodiment as well, the same functions and effects as those of the first embodiment can be obtained besides the functions and effects discussed above.

Seventh Embodiment

A light emitting device according to a seventh embodiment illustrated in FIG. 12 is different from that according to the sixth embodiment only in that the order of movement of the dispenser nozzle 10 is changed. The embodiment is otherwise the same as the sixth embodiment.

In FIG. 12, the moving track of the opening portion of the dispenser nozzle 10 is indicated by the chain double-dashed lines.

At the start of injection, the opening portion of the dispenser nozzle 10 is positioned above one end (in the drawing, the left end) of the opposite location as mentioned in the sixth embodiment. The light-reflective resin 7 is then discharged from the opening portion to be injected while the dispenser nozzle 10 is moved along the arrangement direction of the LEDs 3 as indicated by the white arrow. After that, when the opening portion of the dispenser nozzle 10 is moved to the other end (in the drawing, the right end) of the opposite location, the dispenser nozzle 10 is subsequently moved in the direction orthogonal to the arrangement direction of the LEDs 3 between the LED 3 at the right end and the dam material 6. When the dispenser nozzle 10 is moved to the right end of the injection location as mentioned in the sixth embodiment, the dispenser nozzle 10 is subsequently moved along the arrangement direction of the LEDs 3 at the injection location. When the dispenser nozzle 10 is moved to the left end, the dispenser nozzle 10 is moved in the direction orthogonal to the arrangement direction of the LEDs 3 between the LED 3 at the left end and the dam material 6. During such movement, the light-reflective resin 7 is discharged to be injected. When the light-reflective resin 7 is injected while the dispenser nozzle 10 is moved at the injection location, the clearances between the chips and the gaps under the chips are already filled with the light-reflective resin 7, and therefore no void is formed.

In addition, creating a vacuum atmosphere during or after injection of the light-reflective resin 7 allows part of the light-reflective resin 7 to more easily flow into the gaps. Therefore, formation of a void can be more reliably prevented.

According to the seventh embodiment as well, the same functions and effects as those of the sixth embodiment can be obtained.

Eighth Embodiment

Figure 13A:
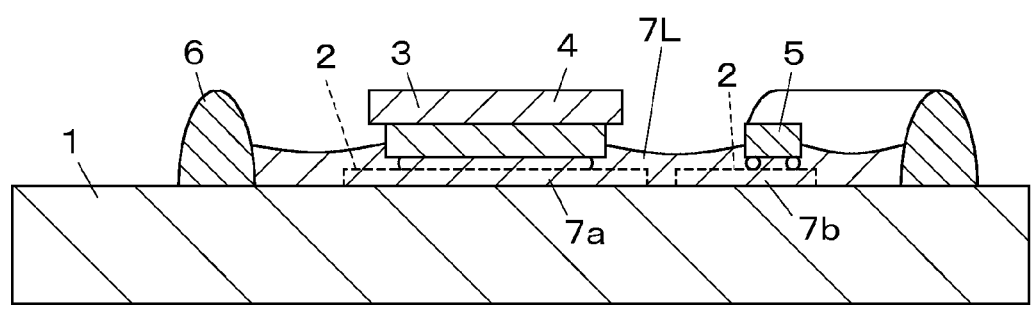
Figure 13B:
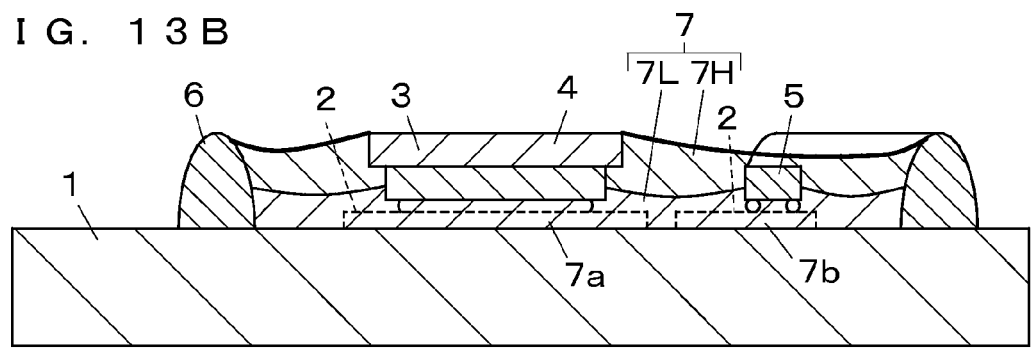
Figure 14A:
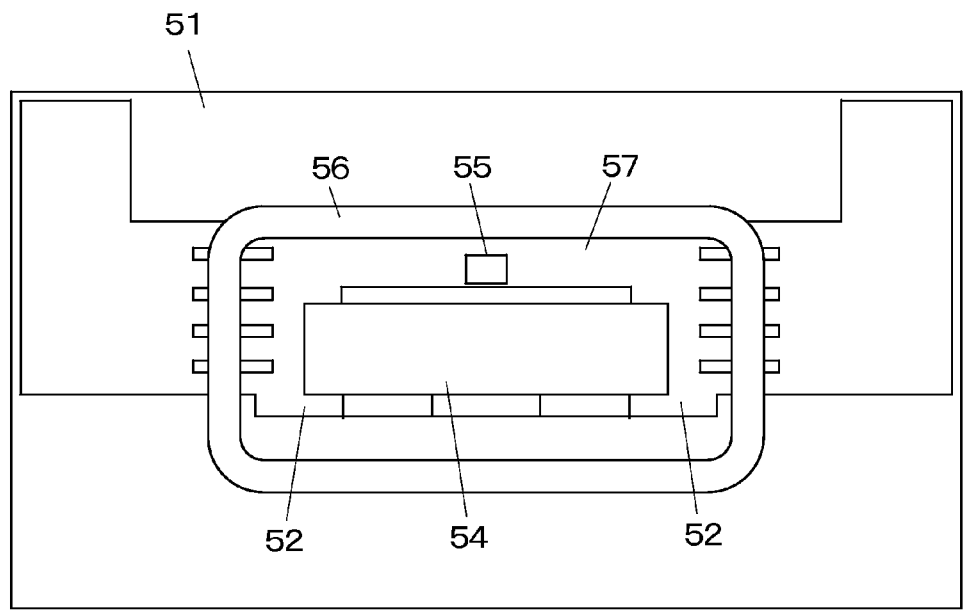
Figure 14B:
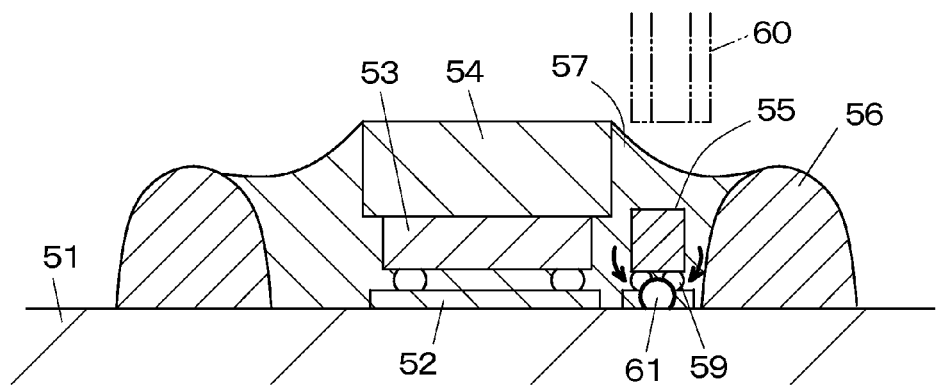

A light emitting device according to an eighth embodiment illustrated in FIG. 13 is different from that according to the first embodiment only in that the light-reflective resin includes a light-reflective resin 7L for a lower layer with a relatively low viscosity and a light-reflective resin 7H for an upper layer with a relatively high viscosity. The embodiment is otherwise the same as the first embodiment.

The light-reflective resin 7 includes the light-reflective resin 7L for the lower layer having a relatively low viscosity before being cured and the light-reflective resin 7H for the upper layer having a relatively high viscosity before being cured, and the light-reflective resin 7L for the lower layer is injected as described above so that part of the light-reflective resin 7L for the lower layer flows into the gaps, and thereafter, the light-reflective resin 7H for the upper layer is injected as described above. The light-reflective resin 7L for the lower layer with a low viscosity can easily flow into the gaps under the ZD 5 and the LEDs 3. The light-reflective resin 7H for the upper layer which may have a high viscosity can contain a larger amount of a light-reflective substance to provide higher light reflectivity.

In addition, creating a vacuum atmosphere during or after injection of the light-reflective resin 7L for the lower layer allows part of the light-reflective resin 7L for the lower layer to more easily flow into the gaps. Therefore, formation of a void can be more reliably prevented.

Further, by using a resin having a relatively low gas permeability as the light-reflective resin 7L for the lower layer with the low viscosity and using a resin having a relatively high gas permeability as the light-reflective resin 7H for the upper layer with the high viscosity, it is possible to effectively prevent corrosion and deterioration of the wiring pattern 2 on the substrate 1, the electrode of LED 3 or the bump especially by the light-reflective resin 7L for the lower layer. As such light reflective resins, phenyl silicone is preferably used as the light-reflective resin 7L for the lower layer, and dimethyl silicone is preferably used as the light-reflective resin 7H for the upper layer.

According to the eighth embodiment as well, the same functions and effects as those of the first embodiment can be obtained besides the functions and effects discussed above. In addition, such a technique can also be adopted in any of the embodiments.

The present invention is not limited to the embodiments described above, and may be modified appropriately without departing from the scope and spirit of the present invention as described below, for example.

(1) In the embodiments, the light-reflective resin 7 also functions as an underfill. In order to more effectively prevent air from being trapped (to form a void), an underfill resin (a light-reflective or transparent thermosetting resin) with a viscosity that is about the same as or equal to or less than that of the light-reflective resin 7 may be applied before injection of the light-reflective resin 7.

(2) In order to further prevent air from being trapped, the underfill resin may be heated (cured) after application of the underfill resin before the light-reflective resin 7 is injected. Heating the underfill resin temporarily reduces the viscosity of the underfill resin before it is cured, which allows air under the chips to be more reliably pushed out. The heating may also partially cure the dam material.

(3) The stage temperature of the dispenser is not specifically limited, but is preferably 40° C. or more. If the stage temperature of the dispenser is 50 to 70° C., in particular, the viscosity of the light-reflective resin can be reduced so that the light-reflective resin can easily flow into the gaps.

REFERENCE SIGNS LIST 1 substrate
2 wiring pattern
3 LED
4 fluorescent plate
5 ZD
6 dam material
6a swell portion
7 light-reflective resin
7a underfill
7b underfill
8 linear bump
9 stud bump
10 dispenser nozzle

The invention claimed is:

1. A light emitting device comprising:
a substrate;
a light-emitting diode chip mounted on the substrate;
a Zener diode chip mounted next to the light-emitting diode chip on the substrate;
a frame-like dam material formed on the substrate to surround the light-emitting diode chip and the Zener diode chip; and
a light-reflective resin injected inside the dam material to coat side surfaces of the light-emitting diode chip and side surfaces and an upper surface of the Zener diode chip,
wherein a part of a first side of a plurality of sides of the frame-like dam material swells outward to surround three of the side surfaces of the Zener diode chip.

2. The light emitting device according to claim 1, wherein a fluorescent plate is placed on the light-emitting diode chip so that an upper surface of the fluorescent plate serves as a light output surface.

3. The light emitting device according to claim 2, wherein a distance between the fluorescent plate and a main portion of the dam material which comprises a portion other than the part of the first side of the dam material is larger than a distance between the Zener diode chip and the part of the first side of the dam material.

4. The light emitting device according to claim 2, wherein a distance between the Zener diode chip and the fluorescent plate is equal to a distance between the fluorescent plate and a main portion of the dam material which is a portion other than the part of the first side of the dam material.

5. The light emitting device according to claim 1, wherein the light-reflective resin flows into a gap under the Zener diode chip and serves as an underfill.

6. The light emitting device according to claim 5, wherein the light-reflective resin comprises a light-reflective resin lower layer having a relatively low viscosity before being cured and a light-reflective resin upper layer having a relatively high viscosity before being cured, and part of the light-reflective resin lower layer serves as the underfill.

7. The light emitting device according to claim 1, wherein the light-reflective resin flows into a gap under the light-emitting diode chip and serves as an underfill.

8. The light emitting device according to claim 1, wherein the part of the first side of the plurality of sides of the frame-like dam material comprises a center portion of a long side of the plurality of sides of the frame-like dam material.

9. The light emitting device according to claim 8, wherein the center portion of the long side of the plurality of sides of the frame-like dam material swells outwardly to form one of a semi-circular shape and a V-shape.

10. The light emitting device according to claim 8, wherein the end portion of the long side of the plurality of sides of the frame-like dam material swells outwardly to form a U-shape.

11. The light emitting device according to claim 8, wherein the center portion of the short side of the plurality of sides of the frame-like dam material swells outwardly to form a V-shape.

12. The light emitting device according to claim 1, wherein the part of the first side of the plurality of sides of the frame-like dam material comprises an end portion of a long side of the plurality of sides of the frame-like dam material.

13. The light emitting device according to claim 1, wherein the part of the first side of the plurality of sides of the frame-like dam material comprises a center portion of a short side of the plurality of sides of the frame-like dam material.

14. The light emitting device according to claim 1, wherein the frame-like dam material swells outwardly to form one of a semi-circular shape, a V-shape, and a U-shape.

15. A method for manufacturing a light emitting device comprising:
    a substrate;
    a light-emitting diode chip mounted on the substrate;
    a Zener diode chip mounted next to the light-emitting diode chip on the substrate;
    a frame-like dam material formed on the substrate to surround the light-emitting diode chip and the Zener diode chip; and
    a light-reflective resin injected inside the dam material to coat side surfaces of the light-emitting diode chip and side surfaces and an upper surface of the Zener diode chip, the method comprising:
    causing a part of a first side of a plurality of sides of the frame-like dam material to swell outward so as to surround three of the side surfaces of the Zener diode chip; and
    setting a distance between a light output surface and the Zener diode chip to be equal to or more than an inside diameter of an opening portion of a dispenser nozzle, and injecting the light-reflective resin from the opening portion of the dispenser nozzle into a space between the light output surface and the side surfaces of the Zener diode chip to flow into a gap under the light-emitting diode chip and a gap under the Zener diode chip so as not to be directly applied to the light output surface and the upper surface of the Zener diode chip.

16. The method for manufacturing a light emitting device according to claim 15, wherein
    a fluorescent plate is placed on the light-emitting diode chip so that an upper surface of the fluorescent plate serves as the light output surface.

17. The method for manufacturing a light emitting device according to claim 15, wherein
    a plurality of the light-emitting diode chips is arranged, and the light-reflective resin is injected while the dispenser nozzle is moved along an arrangement direction of the light-emitting diode chips.

18. The method for manufacturing a light emitting device according to claim 15, wherein
    the light-reflective resin is injected while the dispenser nozzle is moved along the light-emitting diode chip, and the dispenser nozzle is moved along a curved path along a swell shape of the part of the dam material such that the dispenser nozzle is moved away from the light output surface and closer to the side surface of the Zener diode chip when the dispenser nozzle passes between the light output surface and the Zener diode chip.

19. The method for manufacturing a light emitting device according to claim 15, wherein
    the light-reflective resin comprises a light-reflective resin lower layer having a relatively low viscosity and a light-reflective resin upper layer having a relatively high viscosity, and the light-reflective resin lower layer is injected so that part of the light-reflective resin lower layer flows into the gaps, and thereafter, the light-reflective resin upper layer is injected.

20. The method for manufacturing a light emitting device according to claim 15, wherein
    a vacuum atmosphere is created during or after injection of the light-reflective resin.

* * * * *